United States Patent [19]
Hirano et al.

[11] Patent Number: 5,430,671
[45] Date of Patent: Jul. 4, 1995

[54] SEMICONDUCTOR MEMORY DEVICE

[75] Inventors: Hiroshige Hirano, Nara; Tatsumi Sumi, Mishima; Yoshihisa Nagano, Takatsuki, all of Japan

[73] Assignee: Matsushita Electric Industrial Co., Ltd., Kadoma, Japan

[21] Appl. No.: 224,589

[22] Filed: Apr. 7, 1994

[30] Foreign Application Priority Data

Apr. 9, 1993 [JP] Japan .................. 5-083000

[51] Int. Cl.6 ............................... G11C 11/22
[52] U.S. Cl. ................ 365/145; 365/149; 365/207; 365/190; 365/202
[58] Field of Search ........... 365/145, 190, 202, 149, 365/102, 207

[56] References Cited

U.S. PATENT DOCUMENTS

| 4,873,664 | 10/1989 | Eaton, Jr. | 365/145 |
| 5,031,143 | 7/1991 | Jaffe | 365/145 |
| 5,218,566 | 6/1993 | Papaliolios | 365/145 |
| 5,270,967 | 12/1993 | Moazzami et al. | 365/145 |

FOREIGN PATENT DOCUMENTS

| 0486902 | 11/1990 | European Pat. Off. |
| 0495572 | 1/1991 | European Pat. Off. |

*Primary Examiner*—Joseph A. Popek
*Assistant Examiner*—Huan Hoang
*Attorney, Agent, or Firm*—Willian Brinks Hofer Gilson & Lione

[57] ABSTRACT

A semiconductor memory device comprising bit line, word line, plate electrode, ferroelectric capacitor having first electrode and second electrode, said second electrode being coupled to said plate electrode, MOS transistor the source of which is coupled to said first electrode, the gate is coupled to said word line and the drain is coupled to said bit line, and adjusting capacitor for adjusting bit line capacitance coupled to said bit line. The adjusting capacitor is provided to increase the potential difference for reading and control occurrence of operating errors.

21 Claims, 17 Drawing Sheets

F I G. 2
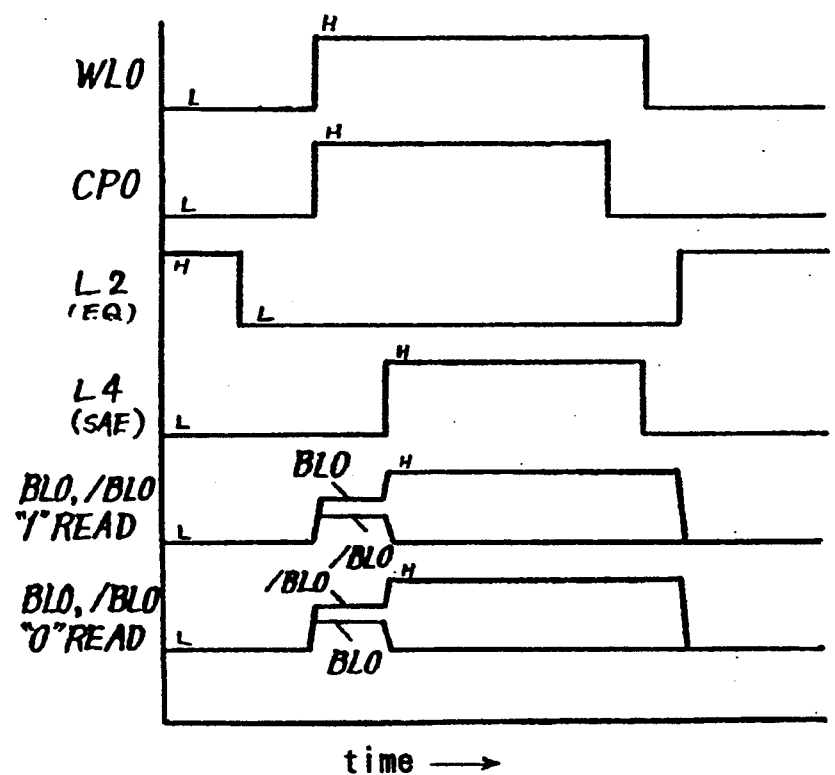

SEMICONDUCTOR MEMORY DEVICE

FIELD OF THE INVENTION

This invention relates to a semiconductor memory device having memory cells formed with ferroelectric capacitors.

BACKGROUND OF THE INVENTION

A dynamic random access memory (DRAM) that a data is stored in a memory cell capacitor thereof is generally known as one of semiconductor memory devices. A silicon oxide film is conventionally used as an insulating film of the memory cell capacitor.

In recent years, various DRAMs using a ferroelectric material for the insulating film of the capacitor have been developed to realize nonvolatility of stored data (U.S. Pat. No. 4,873,664, for example). As one of such DRAMs, a semiconductor memory device having the structure as described below is known.

This semiconductor memory device comprises, as basic components, a memory cell having a MOS transistor and a ferroelectric capacitor, a pair of bit lines coupled to the memory cell, a word line coupled to the memory cell, a plate line coupled to the memory cell, and a sense amplifier coupled to the pair of bit lines. The MOS transistor of the memory cell is coupled to the bit lines while the ferroelectric capacitor is coupled between the MOS transistor and the plate line.

Writing of data in this semiconductor memory device is performed by the method which consists in applying a reverse logical voltage to the ferroelectric capacitor of the memory cell. Reading of data is made by the method which consists in taking out electric charge stored in the ferroelectric capacitor from the pair of bit lines as potential and amplifying the potential difference between those bit lines with the sense amplifier.

However, with a semiconductor memory device of the conventional construction as described above, the potential difference for reading produced between the bit lines diminishes if the parasitic capacitance value of the bit lines gets smaller. For that reason, it becomes impossible to accurately amplify this potential difference with the sense amplifier, leading to frequent errors in the reading.

SUMMARY OF THE INVENTION

A semiconductor memory device of the present invention comprises, as basic components, a bit line, a word line, a plate electrode, a ferroelectric capacitor having a first electrode and a second electrode, this second electrode being coupled to the plate electrode, a MOS transistor the source of which is coupled to the first electrode of the ferroelectric capacitor and the gate of which is coupled to the word line, and an adjusting capacitor coupled to the bit line for adjusting the capacitance of the bit line.

According to this construction, it becomes possible to increase the potential difference for reading from the memory cell because the capacitance value of the bit line is increased by providing the adjusting capacitor. It enables, therefore, controlling occurrence of operating errors in the reading of data.

The present invention is not limited to the semiconductor memory device of the construction described above. As shown in various embodiments to be described later, a semiconductor memory device in which the above-mentioned basic construction is arranged in a plurality of sets, for example, is naturally included in the scope of the claims of the present invention. Therefore, any modified embodiment existing in the true spirit and range of the present invention is included in the scope of the claims.

BRIEF DESCRIPTION OF THE DRAWINGS

FIG. 2 shows the operating timing of the first embodiment of the present invention.

DESCRIPTION OF THE PREFERRED EMBODIMENTS

Embodiment 1

The first embodiment of the present invention will be explained hereafter by referring to FIG. 1, FIG. 2 and FIG. 3.

Bit line BL0 and bit line /BL0 are coupled to sense amplifier SA0 while bit line BL1 and bit line /BL1 are coupled to sense amplifier SA1. The operation of sense amplifiers SA0, SA1 is controlled by sense amplifier control signal SAE supplied from line L4. First electrode of ferroelectric capacitor Cs00 of the memory cell is coupled to bit line BL0 through N-channel type MOS transistor Qn00. Second electrode of capacitor Cs00 is coupled to cell plate electrode CP0. First electrode of ferroelectric capacitor Cs00B of the memory cell is coupled to bit line /BL0 through N-channel type MOS transistor Qn00B. Moreover, second electrode of capacitor Cs00B is coupled to cell plate electrode CP0.

In the same way, respective first electrodes of ferroelectric capacitors Cs01–Cs07 of the memory cell are coupled to bit line BL0 through N-channel type MOS transistors Qn01–Qn07. In like fashion, respective second electrodes of capacitors Cs01–Cs07 are coupled respectively to cell plate electrodes CP1–CP7. Moreover, respective first electrodes of ferroelectric capacitors Cs01B–Cs07B are coupled to bit line /BL0 through N-channel type MOS transistors Qn01B–Qn07B. In addition, respective second electrodes of capacitors Cs01B–Cs07B are coupled respectively to cell plate electrodes CP1–CP7.

Ferroelectric capacitors Cs10–Cs17 and ferroelectric capacitors Cs10B–Cs17B of another column are coupled respectively to bit line BL1 and bit line /BL1 so that the data may be read out in the same way as above. Moreover, MOS transistors Qn01L, Qn02L, Qn02LB are coupled between a pair of bit line BL0 and bit line /BL0 and line L2 supplying equalizing signal and precharge control signal EQ to the bit lines. MOS transistors Qn11L, Qn12L, Qn12LB are coupled between a pair of bit line BL1 and bit line /BL1 and line L2. Furthermore, MOS transistors Qn02L, Qn02LB, Qn12L, Qn12LB are coupled to line L3 with a ground voltage VSS. Here, the precharge potential is equal to the ground voltage.

In addition, to bit lines BL0, /BL0, BL1, /BL1, electrodes on one side of adjusting capacitors Cb0, Cb0B, Cb1, Cb1B for adjusting a bit line capacitance are coupled respectively. The other electrodes of those adjusting capacitors Cb0, Cb0B, Cb1, Cb1B are coupled to line L1 supplying the supply voltage VCC. The voltage applied to those electrodes coupled to line L1 can be set optionally.

Adjusting capacitors Cb0, Cb0B, Cb1, Cb1B are realized by forming a plate electrode of polysilicon on and under the insulating film of silicon oxide. In addition, adjusting capacitors Cb0, Cb0B, Cb1, Cb1B can be formed in a variety of ways with a construction utilizing the gate insulating film of a MOS transistor or utilizing the capacitance against a sub-plate by increasing the length of a bit line, etc.

Next, the operation of this embodiment will be explained hereafter by referring to FIG. 2 and FIG. 3.

Figure 3:
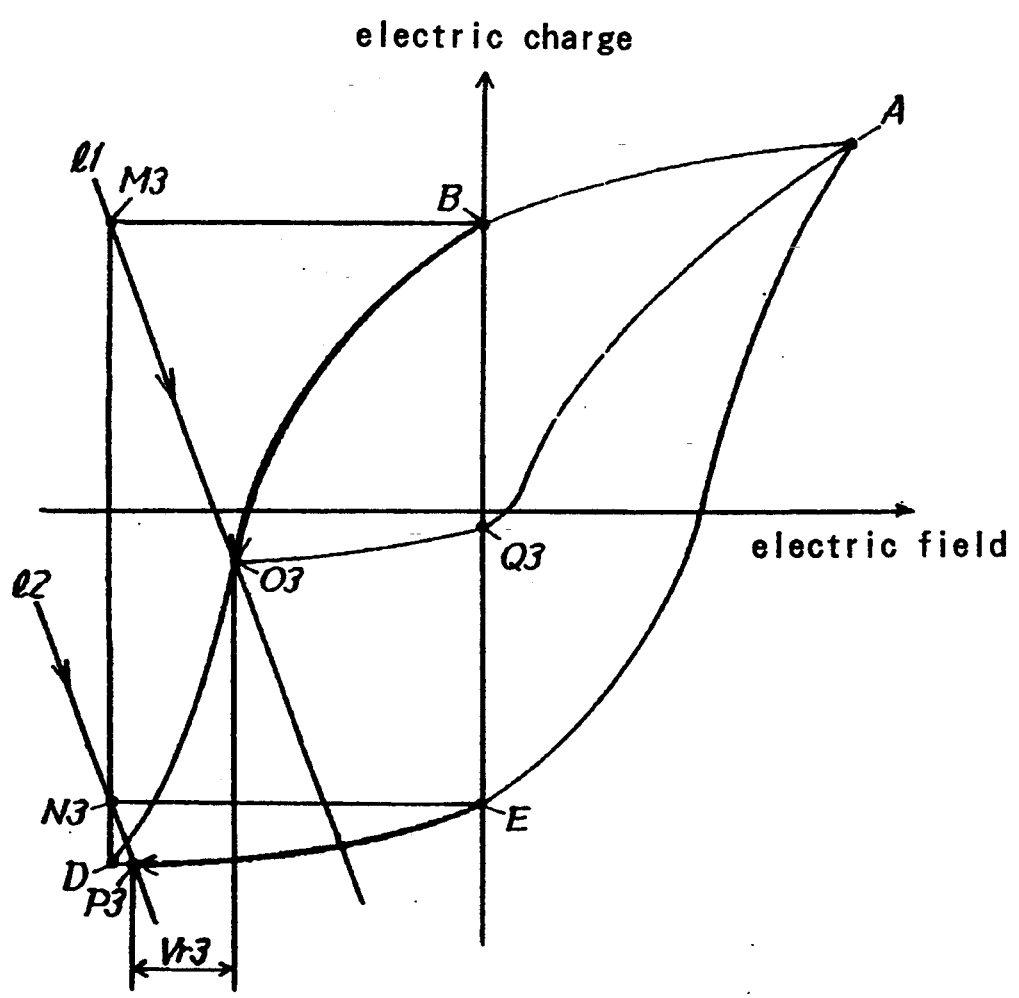
FIG. 3 explains the relation between the hysteresis characteristics of the ferroelectric material used for the ferroelectric capacitor of the memory cell and the data reading operation of the memory cell, in the first embodiment of the present invention.

FIG. 3 explains the hysteresis characteristics of the ferroelectric material. The horizontal axis indicates the electric field applied to the ferroelectric capacitor of the memory cell while the vertical axis represents the electric charge at that time. In a ferroelectric material, residual polarization indicated with point B and point E remains even when the electric field is zero. Therefore, a nonvolatile semiconductor memory device is realized by utilizing the residual polarization remaining in the ferroelectric capacitor as nonvolatile data even if the power supply is interrupted.

When the data in the memory cell is "1", the ferroelectric capacitor on one side of the memory cell is in the state of point B as shown in FIG. 3 while the ferroelectric capacitor on the other side is in the state of point E. When the data in the memory cell is "0", the ferroelectric capacitor on one side is in the state of point E while the ferroelectric capacitor on the other side is in the state of point B. Here, the method for reading out the data in the memory cell having ferroelectric capacitors Cs00, Cs00B will be explained.

First, as shown in FIG. 2, all of bit lines BL0, /BL0, word lines WL0–WL7, cell plate electrodes CP0–CP7 and line L4 supplying control signal SAE are settled to logical voltage "L" (low voltage) and line L2 supplying control signal EQ are settled to logical voltage "H" (high voltage) to read out the data in the memory data. If, after that, line L2 is settled to "L", bit lines BL0, /BL0 get in a floating state.

Next, the voltages of word line WL0 and cell plate electrode CP0 are changed to "H". At that time, an electric field is applied to capacitors Cs00, Cs00B. As a result, the data is read out on bit lines BL0, /BL0 from the memory cell. The potential difference read out on the bit lines at that time will be explained hereafter by referring to FIG. 3.

Line l1 has an inclination dependent on the value of the bit line capacitance equal to the sum of the parasitic capacitance of bit line BL0 and the capacitance of adjusting capacitor Cb0. Line l2 has an inclination dependent on the value of the bit line capacitance equal to the sum of the parasitic capacitance of bit line /BL0 and the capacitance of adjusting capacitor Cb0B. The absolute value of the inclination of line l1 and line l2 diminishes as the capacitance value becomes smaller. When the data read out is "1", the data is read out on bit line BL0 from capacitor Cs00 and the condition of the memory cell with capacitor Cs00 changes from the state of point B to the state of point O3. Point O3 is the point of intersection of the hysteresis curve of capacitor Cs00 moving from point B to point D when an electric field is applied to capacitor Cs00 and the line l1 passing through point M3. However, point M3 is a point moved from point B to the direction of the horizontal axis by a quantity corresponding to the electric field produced when the voltages of word line WL0 and cell plate electrode CP0 are changed to "H".

Likewise, the data is read out on bit line /BL0 from the capacitor Cs00B and the condition of the memory cell with capacitor Cs00B changes from the state of point E to the state of point P3. Point P3 is the point of intersection of the hysteresis curve moving from point E to point D when an electric field is applied to capacitor Cs00B and line l2 passing through point N3. However, point N3 is a point moved from point E to the direction of the horizontal axis by a quantity corresponding to the electric field produced when the voltages of word line WL0 and cell plate electrode CP0 are changed to logical voltage "H".

The potential difference read out between bit line BL0 and bit line /BL0 here is the potential difference Vr3 which is the difference between point O3 and point P3. When the data read out is "0", only the states of bit line BL0 and bit line /BL0 are reversed and the potential difference read out is again the potential difference Vr3.

Next, when the control signal SAE supplied through line L4 to the sense amplifier is changed to "H", the potential difference read out between bit line BL0 and bit line /BL0 is amplified by sense amplifier SA0. At the time of amplification by sense amplifier SA0, the state of bit line BL0 moves from point O3 to point Q3 while the state of bit line /BL0 moves from point P3 to point D.

Next, as the state for rewriting dam, the voltage of cell plate electrode CP0 is changed to "L". At that time, the state of bit line BL0 moves from point Q3 to point A while the state of bit line /BL0 moves from point D to point E. After that, the voltages of word line WL0 and line L4 are changed to "L" and control signal EQ of line L2 is changed to "H". After that, bit line BL0 and bit line /BL0 are settled to "L" to return to the initial state.

The potential difference Vr3 read out between bit line BL0 and bit line /BL0 with this operation must be of a value accurately amplifiable with sense amplifier SA0. The bit line capacitance equal to the sum of the parasitic capacitance of the bit line and the capacitance of the adjusting capacitor i.e. the inclination of lines l1, l2 is determined in a way to satisfy that requirement. In other words, the capacitance value of the adjusting capacitor is decided in such a way that the potential difference obtained by dividing the electric charge read out from capacitor Cs00 by the total capacitance of the bit lines (sum of the parasitic capacitance of the bit line, the capacitance of the adjusting capacitor and the capacitance of the ferroelectric capacitor) my be not less than the minimum operating voltage of the sense amplifier.

By thus determining the capacitance of the adjusting capacitor in a way to increase potential difference Vr3 as much as possible, more accurate and high-speed amplification by sense amplifier becomes possible. For example, with the sense amplifier used for DRAM, its potential difference is settled to no less than approximately 50 mV. In this embodiment, the device is designed to have the maximum potential difference Vr3 to operate at low voltage. For example, the potential difference is settled to approximately 100 mV in a 255K-bit semiconductor memory device with 1-capacitor memory cell type and at approximately 1200 mV in a 1K-bit semiconductor memory device with 2-capacitor memory cell type.

Embodiment 2

Figure 1:
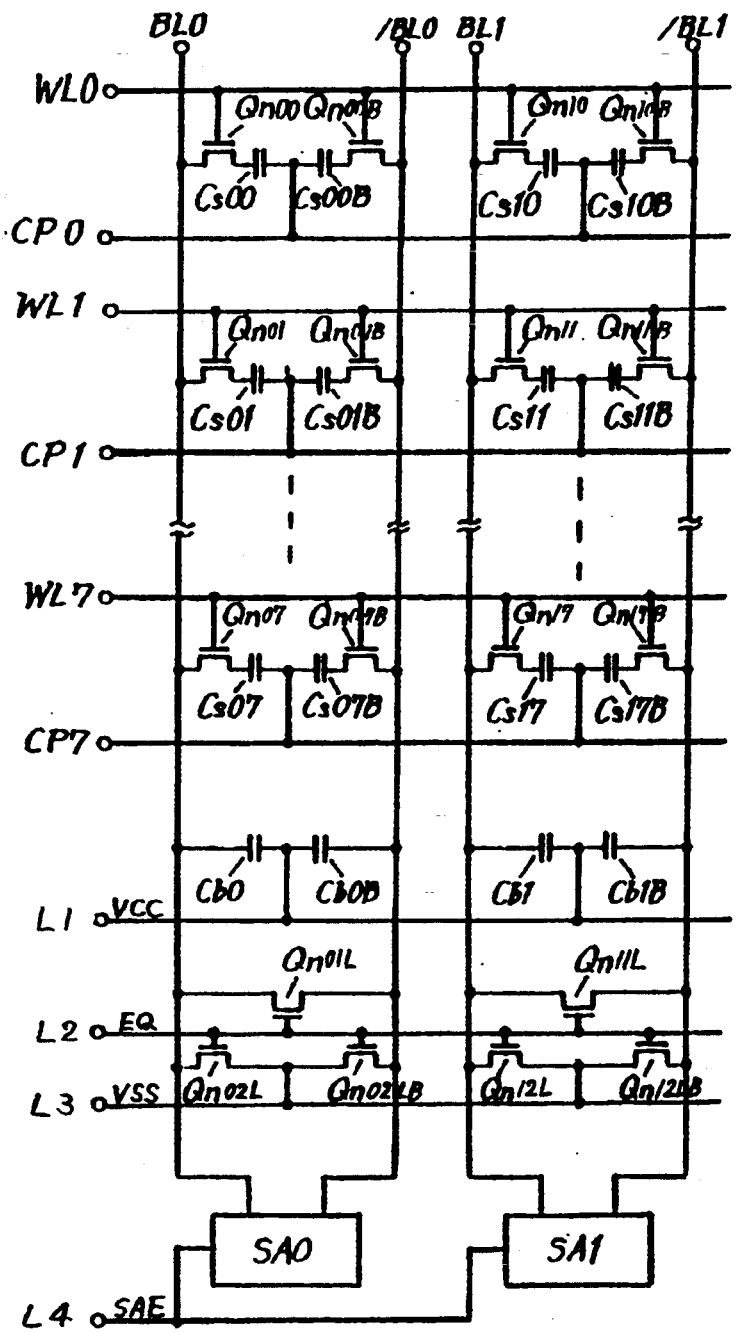
FIG. 1 indicates the circuit construction of the first embodiment of the present invention.
Figure 4:
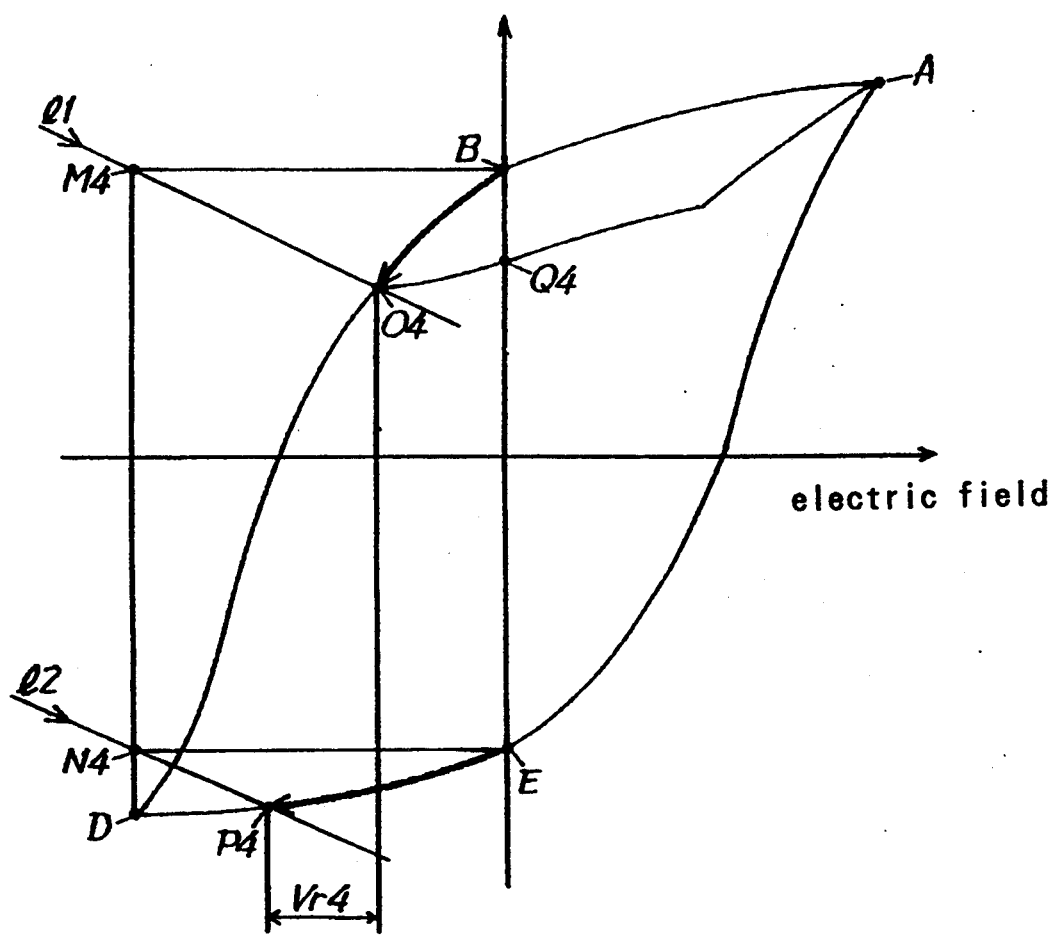
FIG. 4 explains the relation between the hysteresis characteristics of the ferroelectric material used for the ferroelectric capacitor of the memory cell and the data reading operation of the memory cell, in the second embodiment of the present invention.

The circuit construction and the operating timing chart of the second embodiment are indicated in FIG. 1 and FIG. 2 in the same way as for the first embodiment. FIG. 4 indicates the relation between the hysteresis characteristics of the ferroelectric material used for the ferroelectric capacitor of the memory cell and the data reading operation of the memory cell in this embodiment.

In this second embodiment, the bit line capacitance value equal to the sum of the parasitic capacitance of the bit line and the capacitance of the adjusting capacitor is smaller than that in the first embodiment. Namely, the absolute value of the inclination of lines l1, l2 in FIG. 4 is smaller than the value indicated in FIG. 3.

Figure 5:
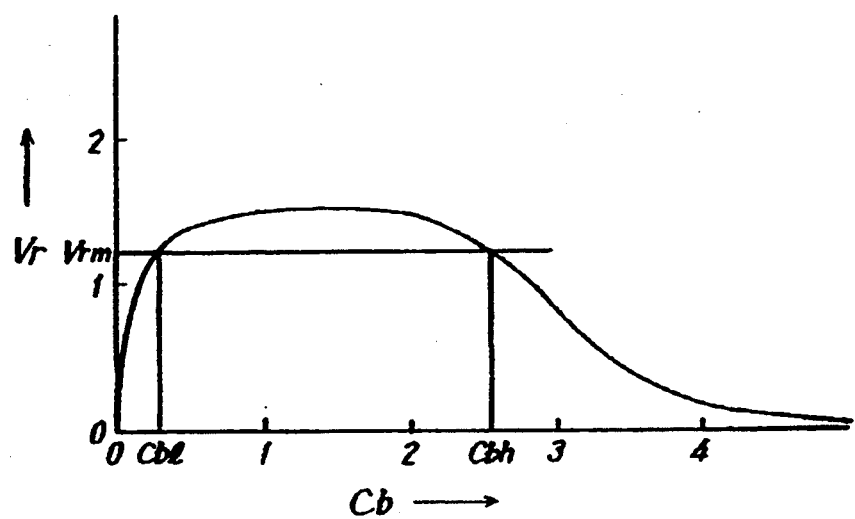
FIG. 5 illustrates the relation between the capacitance of the bit lines and the potential difference for data reading of the memory cell, in the second embodiment of the present invention.

The potential difference read out between bit line BL0 and bit line /BL0 here is the potential difference Vr4. The potential difference Vr4 must be of a value accurately amplifiable with sense amplifier SA0. FIG. 5 illustrates the relation between the bit line capacitance value Cb equal to the sum of the parasitic capacitance of the bit line and the capacitance of the adjusting capacitor and the potential difference Vr read out between bit line BL0 and bit line /BL0. As it is apparent from FIG. 5, the potential difference Vr is expressed with a curve having the maximum value against the bit line capacitance value Cb. In FIG. 5, the potential difference Vrm indicates the minimum value accurately amplifiable with the sense amplifier and readable. Of the points of intersection between this minimum potential difference Vrm and the curve of FIG. 5, the point with smaller capacitance value is given as Cbl while the point with larger capacitance value is indicated as Cbh. As one can clearly see from this FIG. 5, the capacitance value Cb of the bit line must be found between the capacitance value Cbl and the capacitance value as Cbh to read out without any operating error.

If the capacitance value Cb of the bit line is found between Cbl and Cbh, there will be less deterioration of the ferroelectric material constituting the memory cell when the smaller bit line capacitance value Cb is used. To be concrete, by comparison of FIG. 3 and FIG. 4, the second embodiment provides a smaller bit line capacitance value Cb. Namely, the absolute value of the inclination of lines l1, l2 is smaller. For that reason, in the reading operation made when the data of the memory cell is "1", while the condition of the memory cell changes from the state of point B to the state of point O3 in FIG. 3 in the first embodiment, it changes from the state of point B to point O4 in FIG. 4 in the second embodiment. From this fact, one can see that the electric field applied to the ferroelectric material constituting the memory cell is smaller in the second embodiment. Namely, the ferroelectric material is subject to less deterioration because the rate of reversion of the polarization of ferroelectric material is lower. In this way, the smaller the bit line capacitance value Cb to be used between Cbl and Cbh, the smaller the deterioration of the ferroelectric material and longer the life of the memory cell.

Embodiment 3

Figure 6:
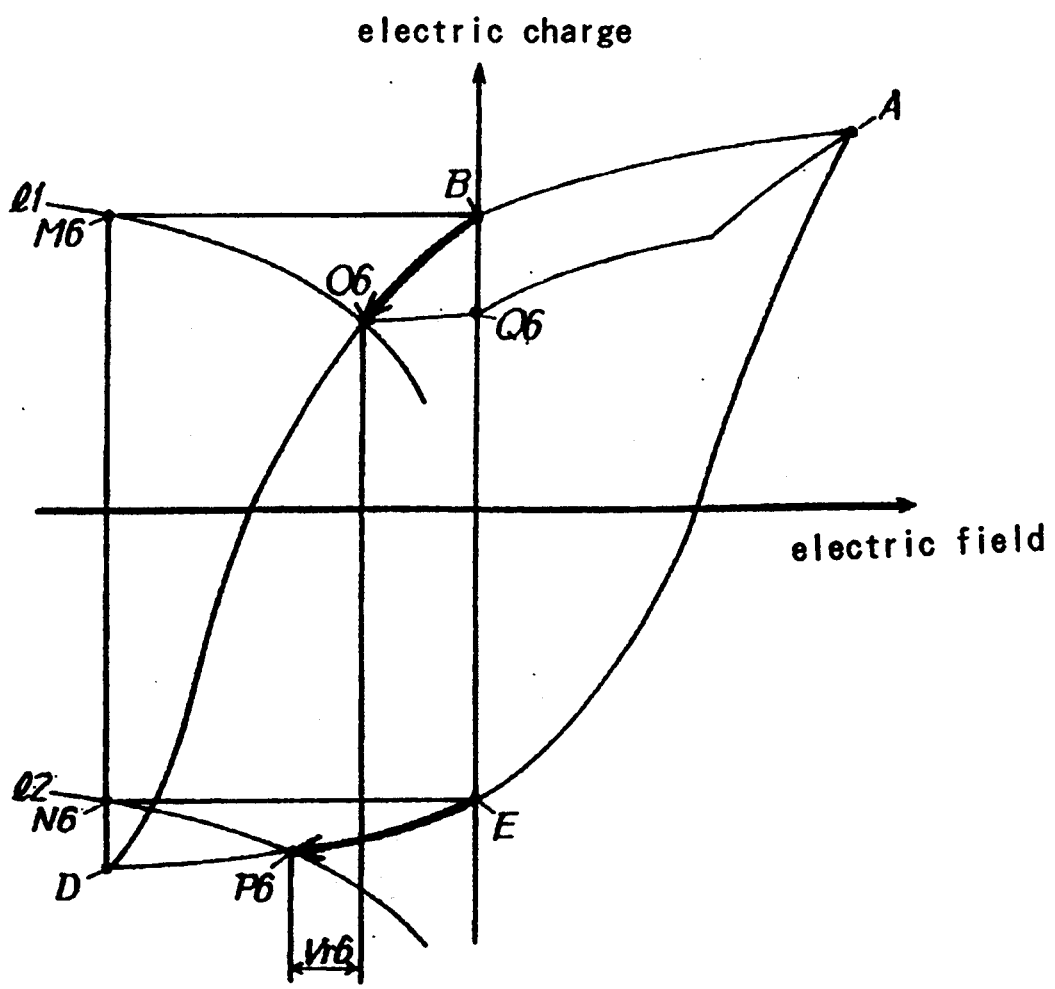
FIG. 6 illustrates the relation between the hysteresis characteristics of the ferroelectric material used for the ferroelectric capacitor of the memory cell and the data reading operation of the memory cell, in the third embodiment of the present invention.

The circuit construction and the operating timing chart of the third embodiment are indicated in FIG. 1 and FIG. 2 in the same way as for the first embodiment. FIG. 6 represents the relation between the hysteresis characteristics of the ferroelectric material used for the ferroelectric capacitor of the memory cell and the data reading operation of the memory cell in the third embodiment.

This third embodiment differs from the first embodiment in that a barium titanate based ferroelectric material is ued for adjusting capacitors Cb0, Cb0B, Cb1, Cb1B for adjusting the bit line capacitance. By using a barium titanate based ferroelectric material for the adjusting capacitors, it becomes possible to obtain a larger capacitance value with a smaller surface area compared with adjusting capacitors realized by using an oxide film other than ferroelectric material such as silicon oxide film, etc.

In the third embodiment, the potential in the standby state of the bit line is given as ground voltage VSS and the electrode on the side not coupled to the bit line of the adjusting capacitor is given as supply voltage VCC. For that reason, the lines l1, l2 in FIG. 6 indicating the capacitance value of the bit line from curves which are convex on the upper side because the potential of the electrode of the adjusting capacitors changes from the supply voltage VCC toward the ground voltage VSS.

In the reading operation, the potential difference read out between bit line BL0 and bit line /BL0 here is the potential difference Vr6 in the same way as in embodiment 1 and embodiment 2. In this third embodiment, a ferroelectric material is used for the adjusting capacitors. Moreover, as the standby state before the reading of data, the potential of the first electrode coupled to the bit line (ground voltage VSS in the standby state) and the potential of the second electrode coupled to the supply voltage VCC (to be applied) to the two electrodes of the adjusting capacitors are reversed with each other. By so doing, it becomes possible to initialize the capacitance value of the capacitors using a ferroelectric material.

In this embodiment, the ground voltage VSS is applied to the electrode on one side (electrode coupled to the bit line) and the supply voltage VCC is applied to the plate (i.e. electrode on the side opposite to the electrode coupled to the bit line) in the standby state. However, the same effect can be obtained even in the contrary case i.e. when the supply voltage VCC is applied to the electrode coupled to the bit line and the ground voltage VSS is applied to the plate electrode.

This embodiment indicates a case where a barium titanate based ferroelectric material is used for the adjusting capacitors. However, it is also possible to use oxides having perovskite structure such as lead titanate, barium zirconate, lead zirconate, etc. and other oxides in which part of the metal component elements of such oxides are replaced with other elements. One may also use ferroelectric materials not having any perovskite structure such as lead niobate, etc.

For the ferroelectric material of adjusting capacitors, it is desirable to use a ferroelectric material of the same base as the material of the ferroelectric capacitors of the memory cell, because it enables to manufacture the adjusting capacitors and the ferroelectric capacitors in one same manufacturing process and simplify the manufacturing process.

Moreover, from the viewpoint of simplification of the manufacturing process, it is desired that the adjusting capacitors and the ferroelectric capacitors are not much different in shape and size from each other. For example, it is desirable to keep the thinness of the ferroelectric film of the two types of capacitors about equal and keep their surface area ratio in the range of 0.5–5.0. By keeping the shape and the size of the ferroelectric film of the two about equal, it becomes possible to much simplify their manufacturing process.

Embodiment 4

Figure 7:
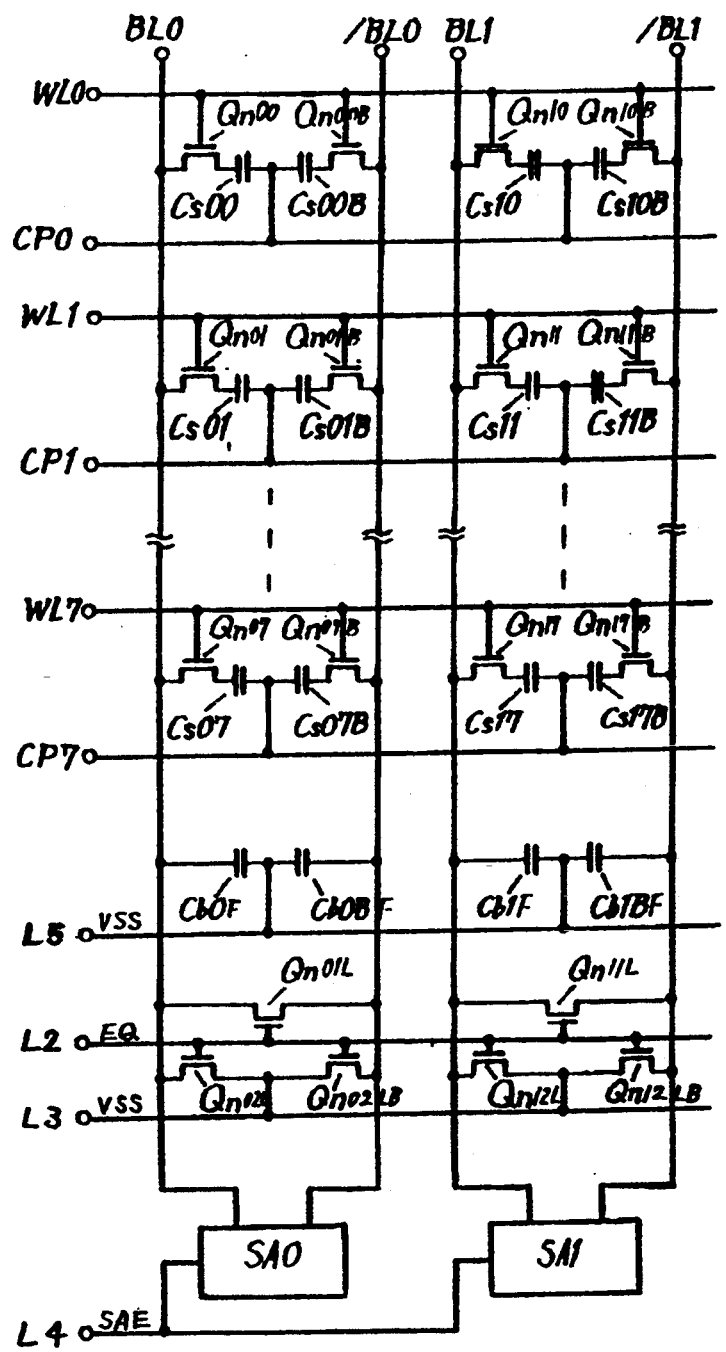
FIG. 7 represents the circuit construction of the fourth embodiment of the present invention.
Figure 8:
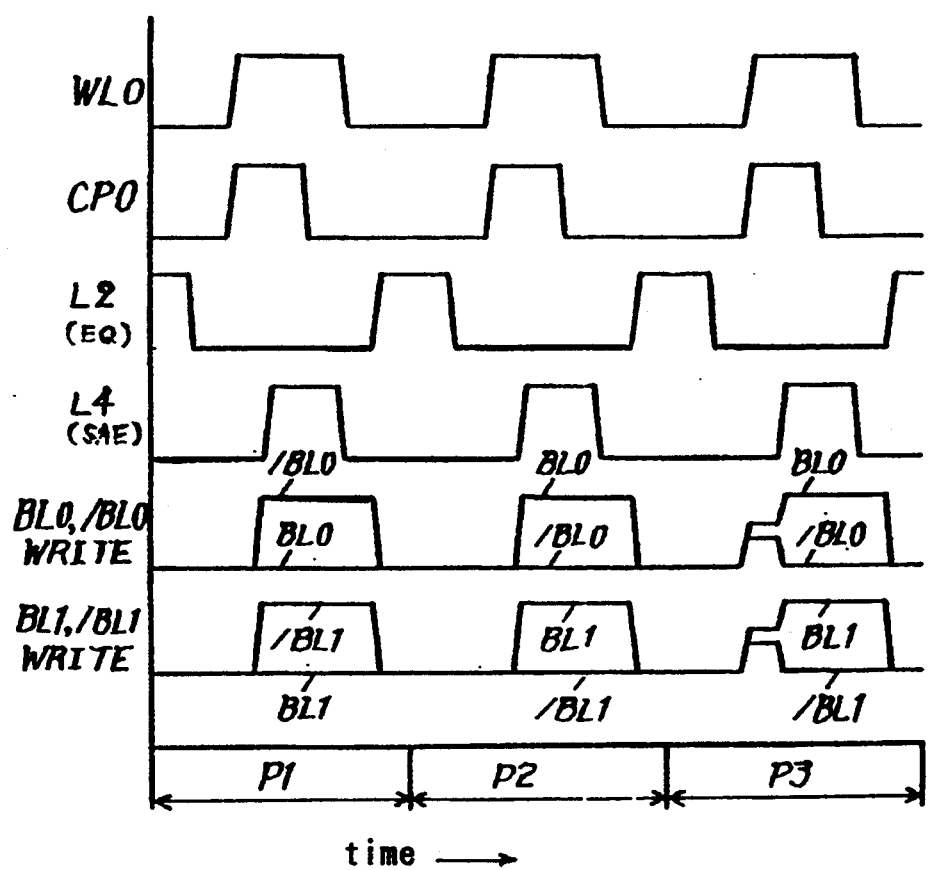
FIG. 8 illustrates the operating timing of the fourth embodiment of the present invention.
Figure 9:
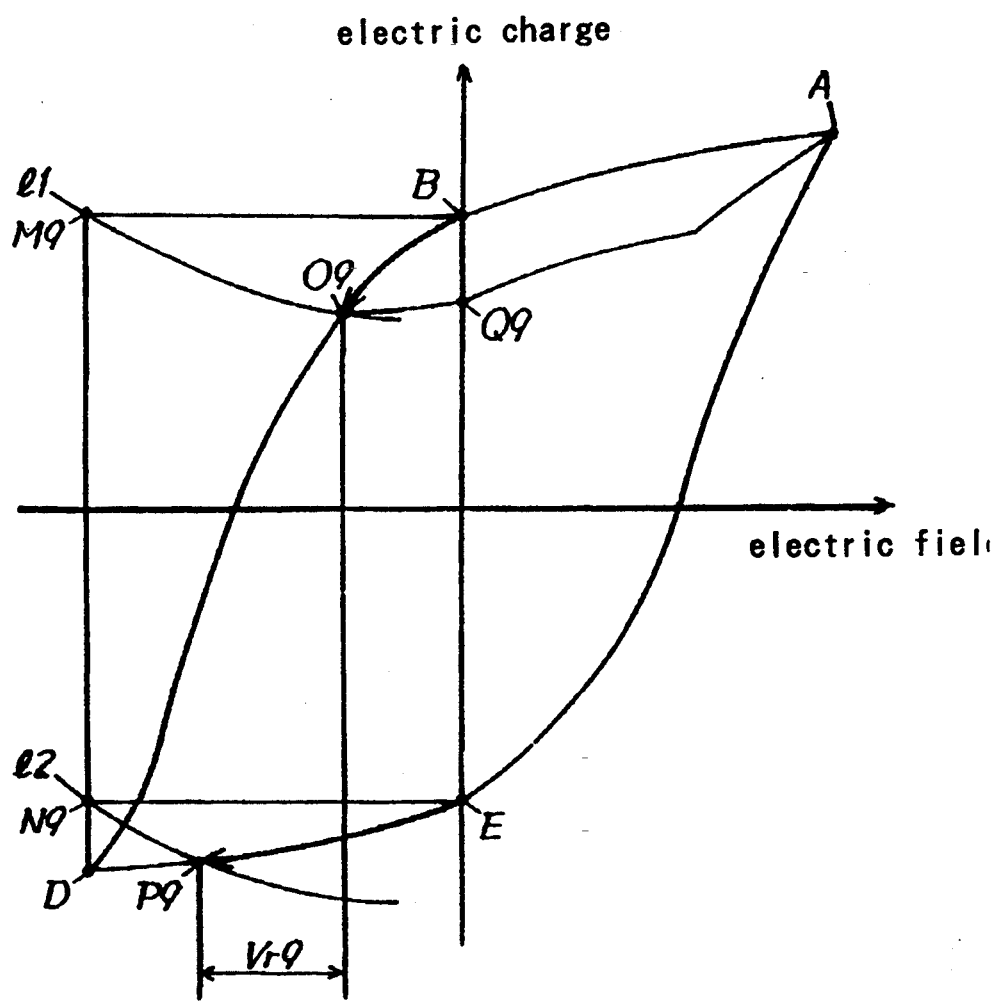
FIG. 9 illustrates the relation between the hysteresis characteristics of the ferroelectric material used for the ferroelectric capacitor of the memory cell and the data reading operation of the memory cell, in the fourth embodiment of the present invention.

FIG. 7 represents the circuit construction of the fourth embodiment while FIG. 8 illustrates its operating timing chart. FIG. 9 indicates the relation between the hysteresis characteristics of the ferroelectric material used for the ferroelectric capacitor of the memory cell and the data reading operation of the memory cell in the fourth embodiment.

In the circuit construction drawing of FIG. 7, this fourth embodiment differs from the first embodiment in that a ferroelectric material is ued for the adjusting capacitors Cb0F, Cb0BF, Cb1F, Cb1BF for adjusting the bit line capacitance and that the electrode coupled to those bit lines is coupled to line L5 which has the ground voltage VSS.

In this kind of semiconductor memory device, the state of polarization of adjusting capacitors Cb0F, Cb0BF, Cb1F, Cb1BF is indeterminate and their capacitance values are not initialized immediately after its manufacture. It is therefore necessary to initialize the state of polarization of the adjusting capacitors against such state immediately after the manufacture.

As a method for such initialization, one makes a writing operation of providing bit line /BL0 with a logical voltage "H" during the period p1 to initialize adjusting capacitor Cb0F. One also makes a writing operation of providing bit line BL0 with a logical voltage "H" during the period p2 to initialize adjusting capacitor Cb0BF. The same is true with bit lines BL1, /BL1 as well. This initialization is enough if one makes it only once after the manufacture of the semi conductor memory device. The period p3 in FIG. 8 indicates the period of reading operation.

Next, in FIG. 9, the lines 11, 12 corresponding to the capacitance value of the bit line form curves which are convex on the lower side because the potential of the bit line in the standby state has the ground voltage VSS and the potential of the electrode opposite to the electrode coupled to the bit lines has the ground voltage VSS. As for the reading operation, the potential difference read out between bit line BL0 and bit line /BL0 is the potential difference Vr9 in the same way as in emboidment 1 and embodiment 2. In this fourth embodiment, no further initialization is required if one makes it once immediately after the manufacture of the semiconductor memory device as in the case of embodiment 3.

Moreover, the two electrodes of adjusting capacitors Cb0F, Cb0BF are in the standby state i.e. have the ground voltage VSS. For that reason, there is no need of storing any electric charge in adjusting capacitor Cb0F, Cb0BF especially at the time off power-on, etc. This helps to reduce the electric power consumption at the time of power-on.

Embodiment 5

Figure 10:
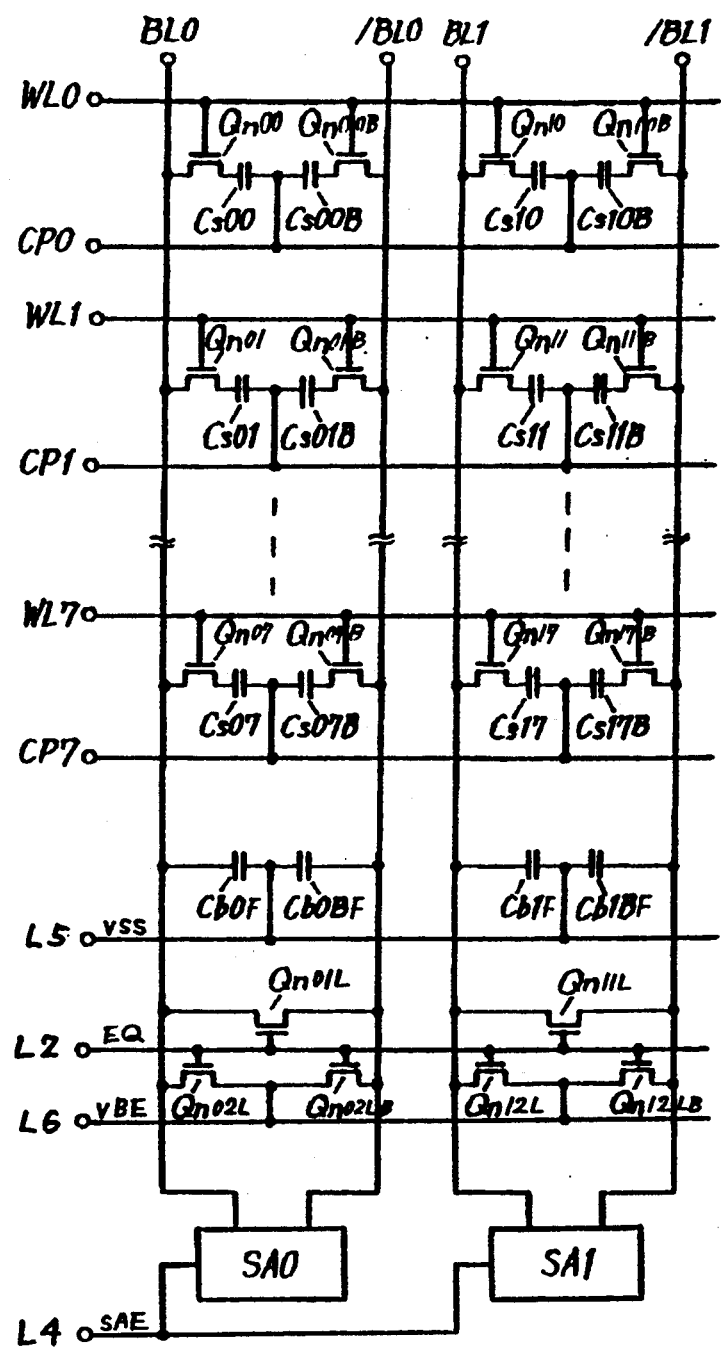
FIG. 10 represents the circuit construction of the fifth embodiment of the present invention.
Figure 11:
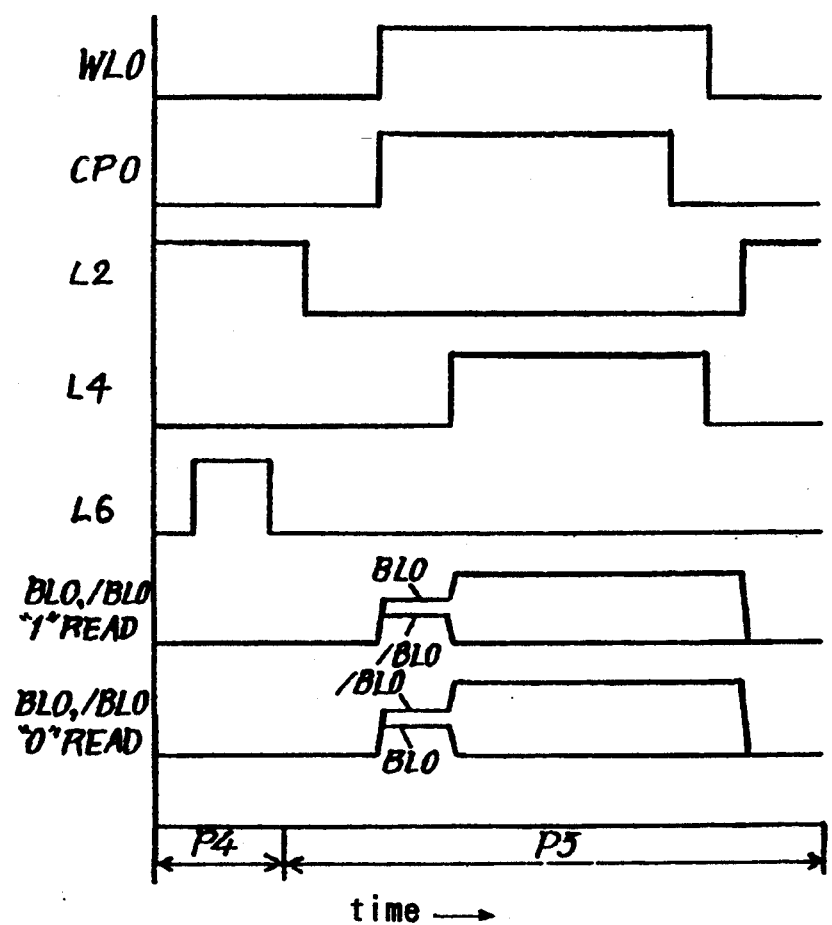
FIG. 11 illustrates the operating timing of the fifth embodiment of the present invention.

FIG. 10 indicates the circuit construction of the fifth embodiment while FIG. 11 illustrates its operating timing chart. The drawing indicating the relation between the hysteresis characteristics of the ferroelectric material uesd for the ferrorlectric capacitor of the memory cell and the data reading operation of the memory cell is the same as that in FIG. 9 of the fourth embodiment.

The circuit construction drawing of FIG. 10 differs from that of the Fourth embodiment in FIG. 7 in that, while the line L3 has the ground voltage VSS in the fourth embodiment, the line L6 corresponding to it has a variable potential VBE in this fifth embodiment.

Immediately after the manufacture of this semiconductor memory device, the state of polarization of adjusting capacitors Cb0F, Cb0BF, Cb 1F, Cb1BF is indeterminate and their capacitance values are not initialized. It is therefore necessary to initialize the state of polarization of those adjusting capacitors against such state immediately after the manufacture.

As a method for such initialization, one provides line L2 and line 6 with an operation of acquiring the logical voltage "H" for the period p4 so that voltages of bit lines BL0, /BL0, BL1, /BL1 are set at "H". Adjusting capacitors Cb0F, Cb0BF, Cb1F, Cb1FB are initialized by this method. This initialization is enough if one makes it only once after the manufacture of the semiconductor memory device. The period p5 here indicates the period of reading operation.

The relation between the hysteresis characteristics of the ferroelectric material used for the ferroelectric capacitor and the data reading operation of the memory cell is the same as that in the fourth embodiment. For that reason, in this fifth embodiment, the initialization of the state of polarization of the adjusting capacitors can be performed at a time by providing the line L6 with a variable potential VBE. Moreover, in the same way as in the fourth embodiment, both of the two electrodes of the adjusting capacitors have the ground voltage VSS in the standby state. For that reason, there is no need of storing any electric charge in the adjusting capacitor especially at the time of power-on, etc. This helps to reduce the electric power consumption at the time of power-on.

Embodiment 6

Figure 12:
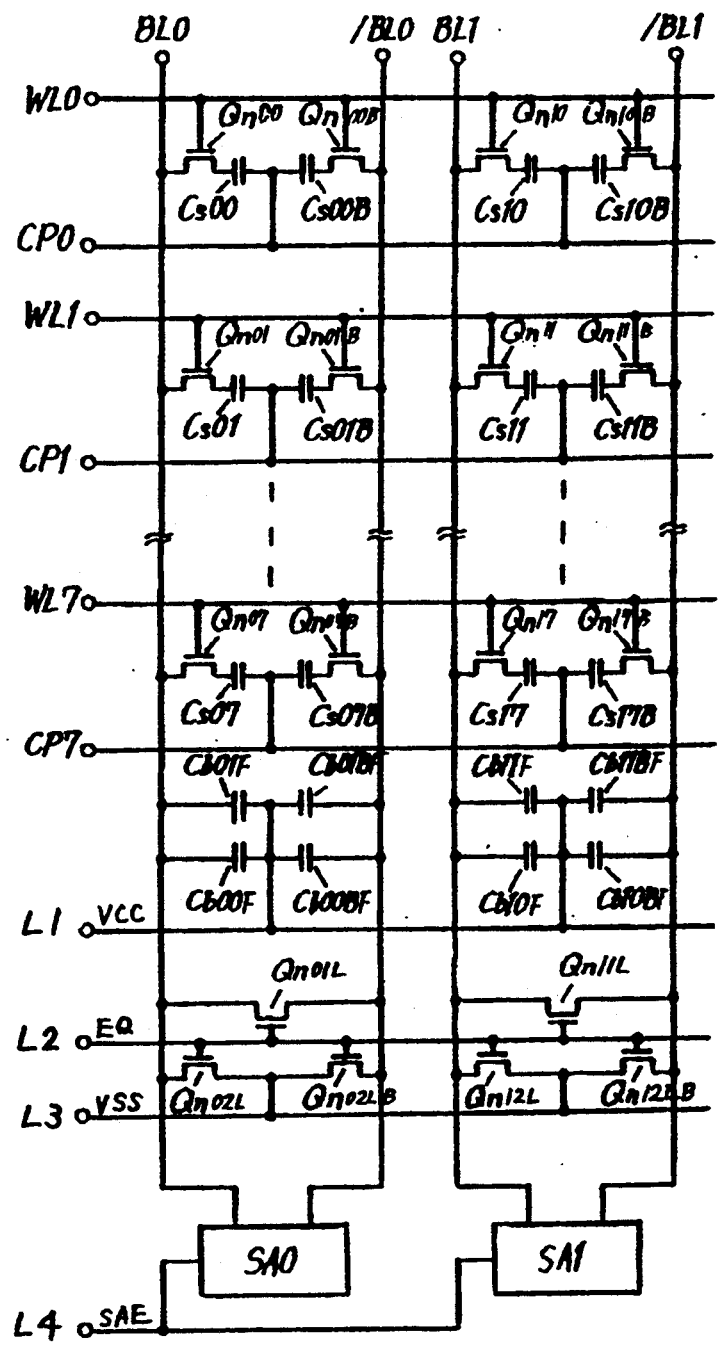
FIG. 12 represents the circuit construction of the sixth embodiment of the present invention.

FIG. 12 represents the circuit construction of the this sixth embodiment. For the operating timing, FIG. 2 is used in the same way as in the third embodiment. The relation between the hysteresis characteristics of the ferroelectric material used for the ferroelectric capacitor of the memory cell and the data reading operation of the memory cell is also represented by FIG. 6 as in the third embodiment.

This sixth embodiment differs from the third embodiment in that the adjusting capacitors using ferroelectric material are split into a plurality of pieces as represented by a pair of adjusting capacitors Cb00F, Cb01F, a pair of adjusting capacitors Cb00BF, Cb01BF, a pair of adjusting capacitors Cb10F, Cb11F and a pair of adjusting capacitors Cb10BF, Cb11BF. Moreover, it is desirable that the respective adjusting capacitors split into a plurality of pieces have a capacitance value about equal to that of the ferroelectric capacitors of the memory cell.

By thus setting the capacitance value of the adjusting capacitors about equal to that of the ferroelectric capacitors of the memory cell and constructing the adjusting capacitors in a plurality of pieces, it becomes possible to maintain the relative value between the change in the capacitance value of the ferroelectric capacitors and the change in the capacitance value of the adjusting capacitors almost unchanged even in the case of a change in the capacitance value of the adjusting capacitors using a ferroelectric material. For that reason, the potential difference Vr6 read out between bit line BL0 and bit line /BL0 can be maintained at a level accurately amplifiable with the sense amplifier SA0. Moreover, by forming the adjusting capacitors and the ferroelectric capacitors of the memory cell in about the shape and the size, it becomes possible to further simplify their manufacturing process.

It is also possible to use capacitors not using any ferroelectric material for the adjusting capacitors.

Embodiment 7

Figure 13:
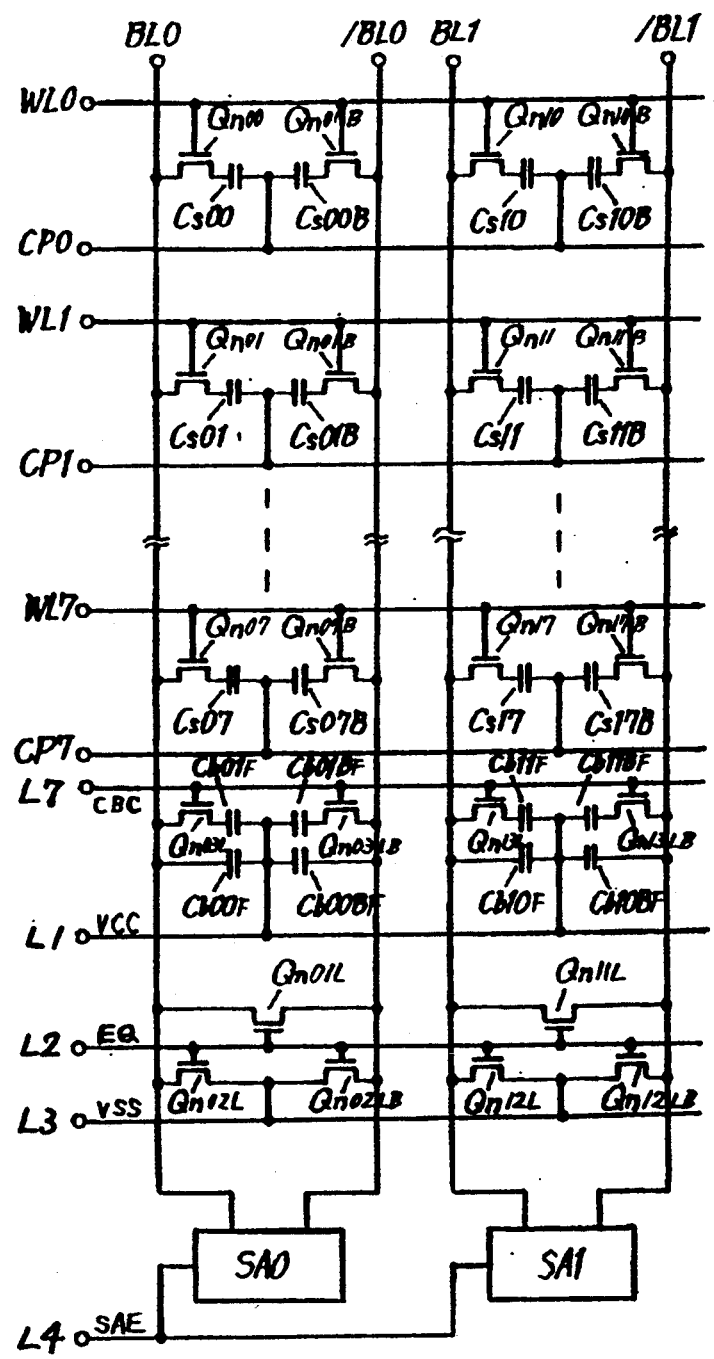
FIG. 13 represents the circuit construction of the seventh embodiment of the present invention.

FIG. 13 represents the circuit construction of the seventh embodiment. The operating timing chart is indicated in FIG. 2 in the same way as in the third embodiment. The drawing showing the relation between the hysteresis characteristics of the ferroelectric material used for the ferroelectric capacitor of the memory cell and the data reading operation of the memory cell is also given in FIG. 6 as in the third embodiment.

This seventh embodiment differs from the third embodiment in that the adjusting capacitors using ferroelectric material are split into a plurality of pieces as represented by a pair of adjusting capacitors Cb00F, Cb01F, a pair of adjusting capacitors Cb00BF, Cb01BF, a pair of adjusting capacitors Cb10F, Cb11F and a pair of adjusting capacitors Cb10BF, Cb11BF. Moreover, the adjusting capacitors Cb01F, Cb01BF, Cb11F, Cb11BF are coupled to the bit lines BL0, /BL0, BL1, /BL1 respectively through N-channel type MOS transistor Qn03L, Qn03LB, Qn13L, Qn13LB. The gate of each N-channel type MOS transistor Qn03L, Qn03LB, Qn13L, Qn13LB is coupled to the line L7 feeding the control signal CBC for adjusting the bit line capacitance.

By setting the logical voltage of the line L7 feeding the control signal CBC at "L", the adjusting capacitors Cb01F, Cb01BF, Cb11F, Cb11BF can be electrically cut from each bit line. This makes it possible to change the capacitance value of the adjusting capacitors easily, i.e. reduce the capacitance value in this case. Therefore, by controlling the control signal CBC, it becomes possible to control the potential difference Vr6 read out between bit line BL0 and bit line /BL0 at a voltage level accurately amplifiable with sense amplifier SA0.

It is also possible to use capacitors not using any ferroelectric material for the adjusting capacitors. Moreover, the adjustment of the capacitance value of the adjusting capacitors can also be made with the use of a physical separating means such as cutting the line in the neighborhood of the adjusting capacitors with laser beam, etc. in addition to the electrical means of switching off by MOS transistor.

Embodiment 8

Figure 14:
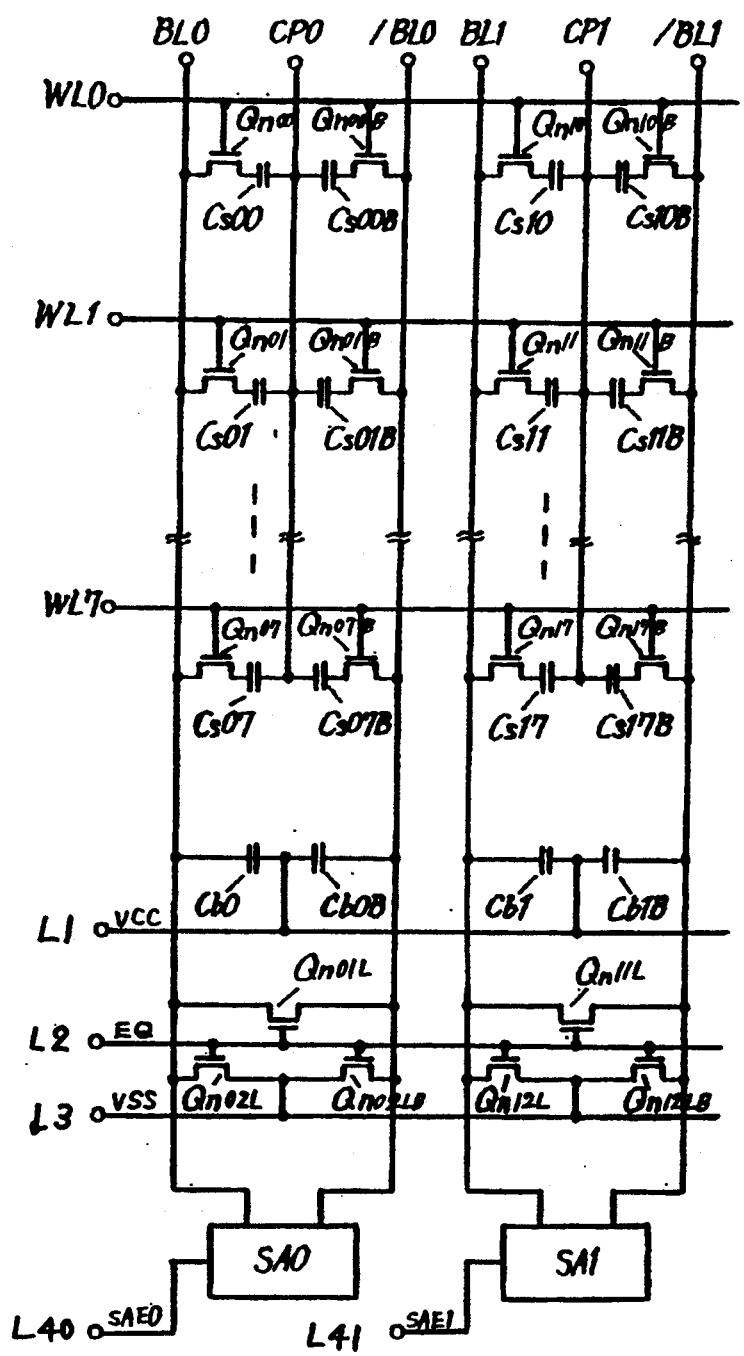
FIG. 14 represents the circuit construction of the eighth embodiment of the present invention.

FIG. 14 represents the circuit construction of the eighth embodiment. The operating timing chart is illustrated in FIG. 2 in the same way as for the first embodiment. The drawing indicating the relation between the hysteresis characteristics of the ferroelectric material used for the ferroelectric capacitor of the memory cell and the data reading operation of the memory cell is given in FIG. 3 in the same way as for the first embodiment.

This eighth embodiment differs from the first embodiment in that cell plate electrodes CP0, CP1 coupled to the memory cells are arranged in parallel with bit lines BL0, /BL0, BL1, /BL1. Sense amplifier SA0 coupled to line L40 is coupled to bit line BL0, /BL0, and sense amplifier SA1 coupled to line L41 is coupled to bit line BL1, /BL1. The memory cell data can be read from only selected memory cell. Namely, the data is read out only from the memory cell positioned at the point of intersection between the word line having the logical voltage "H" and the cell plate electrode having the logical voltage "H". For that reason, sense amplifiers SA0, SA1 are controlled by two signals i.e. control signal SAE0 fed by line L40 and control signal SAE1 fed by line L41 to sense amplifiers SA0, SA1 respectively. The construction in which adjusting capacitors Cb0, Cb0B, Cb1, Cb1B are coupled to the bit line and the effects of that construction are the same as those in the first embodiment.

Embodiment 9

Figure 15:
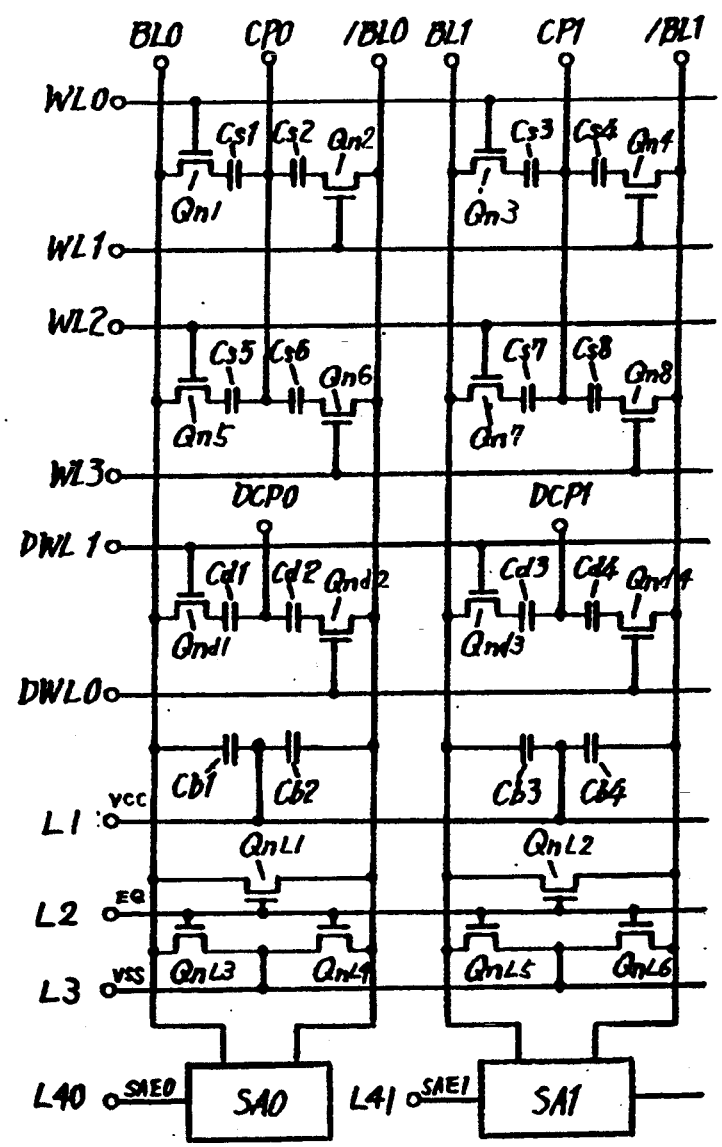
FIG. 15 represents the circuit construction of the ninth embodiment of the present invention.
Figure 16:
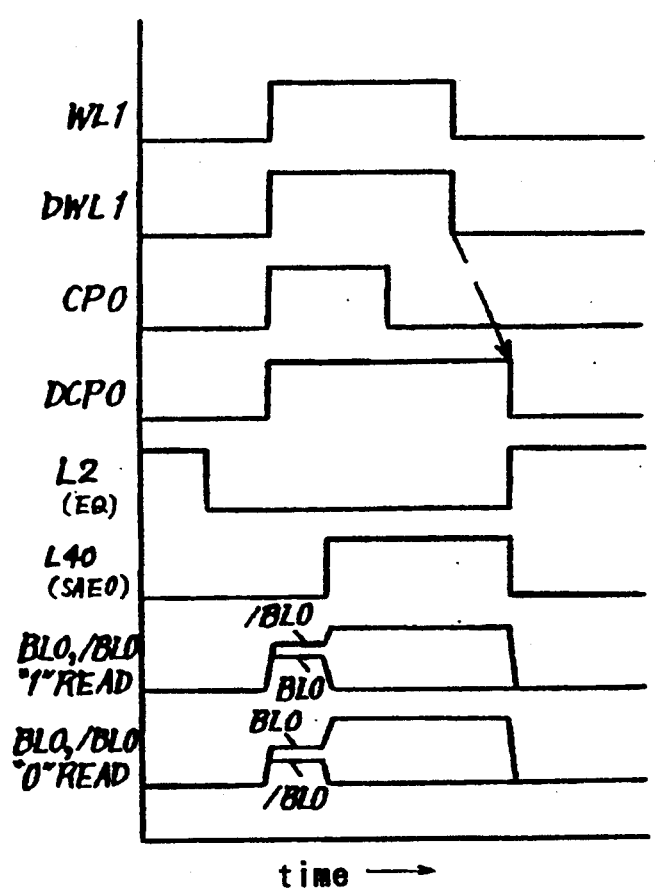
FIG. 16 illustrates the operating timing of the ninth embodiment of the present invention.
Figure 17:
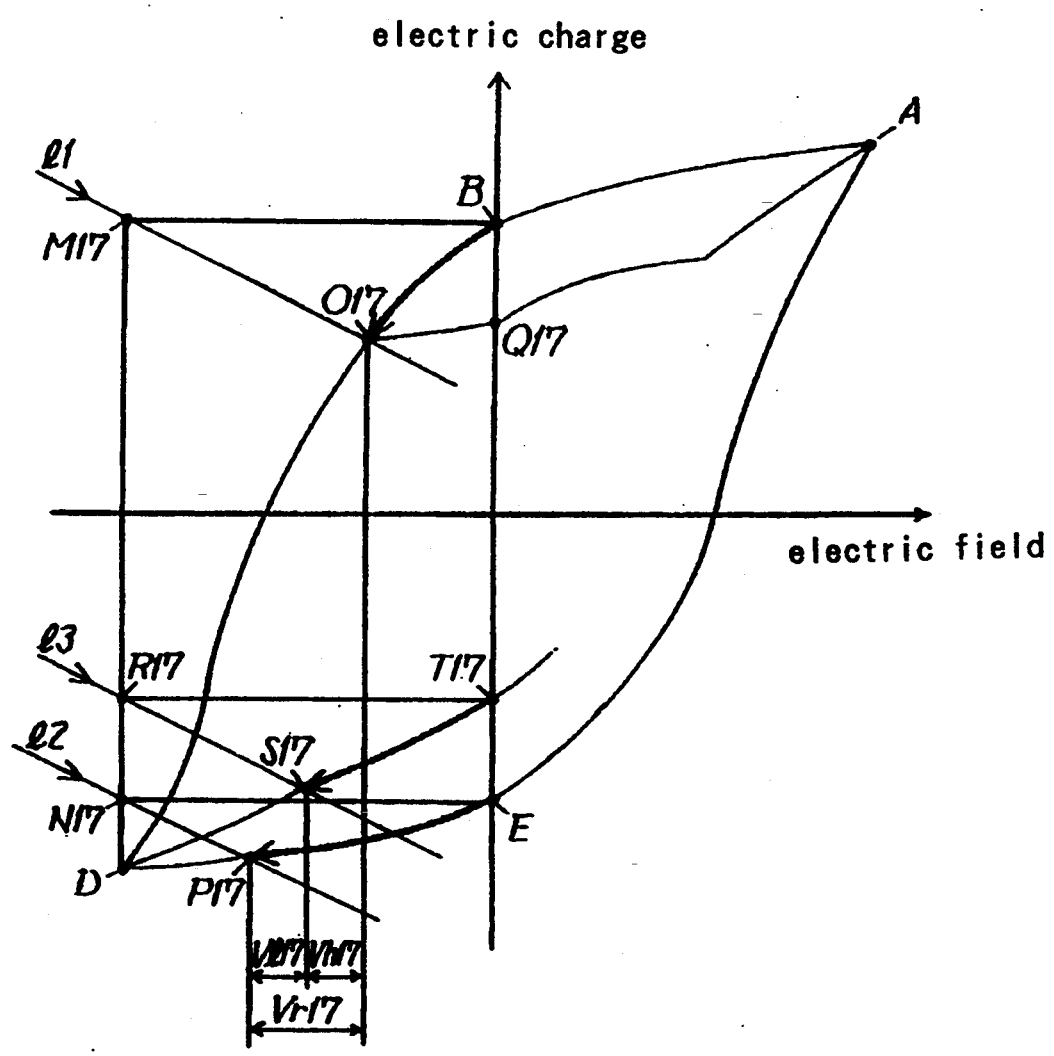
FIG. 17 explains the relation between the hysteresis characteristics of the ferroelectric material used for the ferroelectric capacitor of the memory cell and the data reading operation of the memory cell, in the ninth embodiment of the present invention.

FIG. 15 represents the circuit construction of the ninth embodiment while FIG. 16 illustrates its operating timing chart. FIG. 17 indicates the relation between the hysteresis characteristics of the ferroelectric material used for the ferroelectric capacitor of the memory cell and the data reading operation of the memory cell.

The main difference between this ninth embodiment and the first embodiment is that one memory cell is constituted by one ferroelectric capacitor and one MOS transistor in the ninth embodiment while it consists of two ferroelectric capacitors and two MOS transistors in the first embodiment.

First, as shown in FIG. 15, this semiconductor memory device is composed of word lines WL0–WL3, dummy word lines DWL0–DWL1, bit lines BL0, /BL0, BL1, /BL1, cell plates electrodes CP0, CP1, dummy cell plates electrodes DCP0, DCP1, line L2 feeding equalizing signal and precharge control signal EQ for bit lines, line L40 and line L41 feeding sense amplifier control signals SAE0, SAE1 to sense amplifiers SA0, SA1, ferroelectric capacitors Cs1–Cs8 of memory cell, dummy ferroelectric capacitors Cd1–Cd4, N-channel type MOS transistors Qn1–Qn8, Qnd1–Qnd4, QnL1–QnL6 and adjusting capacitors Cb1, Cb2, Cb3, Cb4.

One memory cell is constituted, for example, by a ferroelectric capacitor Cs1 and a MOS transistor Qnd1 the gate of which is coupled to word line WL0. And the first electrode of ferroelectric capacitor Cs1 is coupled to the source of MOS transistor Qn1. The second electrode of ferroelectric capacitor Cs1 is coupled to cell plate electrode CP0. Moreover, the drain of MOS transistor Qn1 is coupled to bit line BL0. Other memory cells are also constructed in the same way.

Similarly, the dummy memory cells are also composed of a dummy ferroelectric capacitor Cd1 and a MOS transistor Qnd1 the gate of which is coupled to dummy word line DWL0. The first electrode of ferroelectric capacitor Cd1 is coupled to the source of MOS transistor Qnd1. The second electrode of ferroelectric capacitor Cd1 is coupled to dummy cell plate electrode DCP0. Moreover, the drain of MOS transistor Qnd1 is coupled to the bit line BL0. Other dummy memory cells are also constructed in the same way.

The electrode on one side of adjusting capacitor Cb11, Cb2, Cb3, Cb4 is coupled to each of bit lines BL0, /BL0, BL1, /BL1 and the electrode on the other side is coupled to line L1 having the supply voltage VCC. However, the voltage of the electrode coupled to line L1 can be set optionally.

Furthermore, a pair of bit lines BL0, /BL0 and a pair of bit lines BL1, /BL1 are coupled respectively to sense amplifiers SA0, SA1. Sense amplifiers SA0, SA1 are controlled respectively by the sense amplifier control signals SAE0, SAE1 and operate respectively when sense amplifier control signals SAE0, SAE1 have the logical voltage "H". Moreover, bit line BL0 and bit line /BL0 are coupled each other through MOS transistor QnL1, and bit line BL1 and bit line /BL1 are coupled each other through MOS transistor QnL2. And then bit line BL0 and bit line /BL0 are coupled each other through MOS transistors QnL3, QnL4, and bit line BL1 and bit line /BL1 are coupled each other through MOS transistors QnL5, QnL6. The gates of MOS transistors QnL1–QnL6 are coupled to line L2.

To read out the data in the memory cells, all of word lines WL0–WL3, dummy word lines DWL0, DWL1, cell plate electrodes CP0, CP1, dummy cell plate electrodes DCP0, DCP1 and lines L40, L41 feeding control signals SAE0, SAE1 are settled to logical voltage "L". In addition, line L2 feeding bit line equalizing signal and precharge control signal EQ is settled to logical voltage "H" and bit lines BL0, /BL0, BL1, /BL1 are settled to "L". After that, the voltage of line L2 is settled to "L" so that the bit lines are put in the floating state.

Next, to read out the data of ferroelectric capacitor Cs2, word line WL1, dummy word line DWL1, cell plate electrode CP1 and dummy cell plate electrode DCP1 are all settled to "H". As a result, the data of the dummy memory cell is read out on bit line BL0 and the data of the memory cell is read out on bit line /BL0. If, at that time, the data of the memory cell is "1", the condition of the memory cell changes from the state of point B to the state of point O17 in FIG. 17. If the data of the memory cell is "0", the condition of the memory cell changes from the state of point E to the state of point P17 and that of the dummy memory cell changes from the state of point T17 to the state of point S17. If, after that, one operates sense amplifier SA0 by setting the line L40 to logical voltage "H", the data road out on bit lines BL0, /BL0 is amplified. If the data of the memory cell is "1" in the state where the data is amplified with an operation of the sense amplifier, the condition of the memory cell changes from the state of point O17 to the state of point Q17 and that of the dummy memory cell changes from the state of point S17 to the state of point P17. If, at this time, the data of the memory cell is "0", the condition of the memory cell changes from the state of point P17 to the state of point D and that of the dummy memory cell changes from the state of point S17 to the state of point T17.

Next, cell plate electrode CP0 is settled to logical voltage "L". If, at that time, the data of the memory cell is "1", the condition of the memory cell changes from the state of point Q17 to the state of point A and that of the dummy memory cell maintains the state of point D. If the data of the memory cell is "0", the condition of the memory cell moves from the state of point D to the state of point E and that of the dummy memory maintains the state of point T17.

Next, word line WL1 and dummy word lines DWL1 are settled to "L". If, at that time, the data of the dummy cell is "1", the condition of the memory cell changes from the state of point A to the state between point A and point B and that of the dummy memory cell changes from the state of point D to the state between point D and point T17. After that, the condition of the dummy memory cell is placed in the state of point T17. If the data of the memory cell is "0", the condition of the memory cell maintains the state of point E while that of the dummy memory cell maintains the state of point T17.

Next, dummy cell plate electrode DCP0 is settled to "L", line L40 is settled to "L", line L2 is settled to "H" and bit lines BL0, /BL0 are settled to "L" respectively.

In this ninth embodiment, the capacitance value of the bit lines is determined from the capacitance value equal to the sum of the parasitic capacitance of the bit lines and the capacitance of the adjusting capacitors. This capacitance value of the bit lines decides the inclination of lines 11, 12, 13. The inclination of lines 11, 12, 13 shall preferably be decided in such a way that the reading potential difference Vr17 of the data "1" and the data "0" of the memory cell may be at least twice as large as the potential difference accurately amplifiable with the sense amplifier. Namely, the capacitance value of the adjusting capacitor shall preferably be decided so as to satisfy the above condition.

Next, to determine the capacitance value of the dummy memory cell, the point of intersection of the curve indicating the capacitance of the dummy memory cell i.e. the line passing through points D, T17 and the line 13 passing through point R17 is designated as point S17. However, point R17 is a point moved from point T17 to the direction of the horizontal axis by a quantity corresponding to the electric field produced immediately after word line WL0 and cell plate electrode CP0 are brought to logical voltage "H". Line 13 passing through point R17 is a line obtained by displacing the lines 11, 12 in parallel. At that time, the potential difference Vl17 between point S17 and point P17 and the potential difference Vh17 between point S17 and point O17 are set at voltage values which can be accurately amplifiable with the sense amplifier. It will be ideal if those potential differences are maintained at Vl17=Vh17=Vr17/2. By thus determining the capacitance of the adjusting capacitors, accurate and high-speed amplification becomes possible with the sense amplifier.

Besides, it is possible to modify the construction of the adjusting capacitors and the condition for setting voltages of the respective electrodes of the adjusting capacitors at standby in this embodiment to those described in the embodiments 1-8.

What is claimed is:

1. A semiconductor memory device comprising:
   a bit line;
   a word line;
   a plate electrode;
   a ferroelectric capacitor having a first electrode and a second electrode, said second electrode being coupled to said plate electrode;
   a MOS transistor, the source of which is coupled to said first electrode, the gate is coupled to said word line and the drain is coupled to said bit line; and
   an adjusting capacitor for adjusting bit line capacitance coupled to said bit line, wherein said adjusting capacitor comprises a ferroelectric film.

2. The semiconductor memory device of claim 1 wherein a component system of a material of said ferroelectric film is identical to that of a material of said ferroelectric capacitor.

3. The semiconductor memory device of claim 1 wherein a shape and a size of said adjusting capacitor are about the same as a shape and a size of said ferroelectric capacitor.

4. A semiconductor memory device comprising:
   a first bit line and a second bit line;
   a word line;
   a plate electrode;
   a ferroelectric capacitor having a first electrode and a second electrode, said second electrode being coupled to said plate electrode;
   a MOS transistor the source of which is coupled to said first electrode, the gate is coupled to said word line and the drain is coupled to said first bit line;
   an adjusting capacitor for adjusting bit line capacitance coupled to said first bit line; and
   a sense amplifier to which said first bit line and said second bit line are coupled;
   wherein said adjusting capacitor has a capacitance value decided in such a way that a potential difference between a reading potential of said first bit line and a reading potential of said second bit line is not less than a minimum operating voltage of said sense amplifier.

5. The semiconductor memory device of claim 4 wherein said capacitance value is a minimal value.

6. A semiconductor memory device comprising:
   a first bit line and a second bit line;
   a word line;
   a plate electrode;
   a signal line;
   a ferroelectric capacitor having a first electrode and a second electrode, said second electrode being coupled to said plate electrode;
   a MOS transistor the source of which is coupled to said first electrode, the gate is coupled to said word line and the drain is coupled to said first bit line;
   a first adjusting capacitor and a second adjusting capacitor for adjusting bit line capacitance, said first adjusting capacitor being coupled to said first bit line, and said second adjusting capacitor being coupled to said second bit line; and
   a sense amplifier to which said first bit line and said second bit line are coupled.

7. The semiconductor memory device of claim 6 wherein said first adjusting capacitor has a pair of electrodes, and a logical voltage of one of said electrodes and a logical voltage of the other of said electrodes are different from each other when said semiconductor memory device is on standby.

8. The semiconductor memory device of claim 6 wherein said first adjusting capacitor and said second adjusting capacitor include of a plurality of capacitors respectively.

9. The semiconductor memory device of claim 8 wherein each of said plurality of capacitors has a capacitance value about equal to that of said ferroelectric capacitor.

10. The semiconductor memory device of claim 8 wherein a separating means is provided between at least one of said plurality of capacitors and said first and second bit line.

11. The semiconductor memory device of claim 6 wherein said first adjusting capacitor and said second adjusting capactior comprise a ferroelectric film.

12. A method for initializing said first adjusting capacitor and said second adjusting capacitor of the semiconductor memory device of claim 11 comprising the steps of applying a logical voltage "L" to said first bit line and a logical voltage "H" to said second bit line, and applying a logical voltage "H" to said first bit line and a logical voltage "L" to said second bit line.

13. A method for initializing said first adjusting capacitor and said second adjusting capacitor of the semiconductor memory device of claim 11 comprising the step of applying a logical voltage "H" to said first bit line and said second bit line.

14. The semiconductor memory device of claim 3 wherein said first adjusting capacitor has a pair of electrodes, and a logical voltage of one of said electrodes and a logical voltage of the other of said electrodes are both at "L" when said semiconductor memory device is on standby.

15. A method for initializing said first adjusting capacitor and said second adjusting capacitor of the semiconductor memory device of claim 14 comprising the steps of applying a logical voltage "L" to said first bit line and a logical voltage "H" to said second bit line, and applying a logical voltage "H" to said first bit line and a logical voltage "L" to said second bit line.

16. A method for initializing said first adjusting capacitor and said second adjusting capacitor of the semiconductor memory device of claim 14 comprising the step of applying a logical voltage "H" to said first bit line and said second bit line.

17. A semiconductor memory device comprising:
   a first bit line and a second bit line forming a pair;
   a first word line and a second word line;
   a first plate electrode and a second plate electrode;
   a signal line;

a first ferroelectric capacitor coupled to said first plate electrode and a second ferroelectric capacitor electrode coupled to said second plate electrode;

a first MOS transistor the source of which is coupled to said first ferroelectric capacitor, the gate is coupled to said first word line and the drain is coupled to said first bit line;

a second MOS transistor the source of which is coupled to said second ferroelectric capacitor, the gate is coupled to said second word line and the drain is coupled to said second bit line;

a first adjusting capacitor coupled between said first bit line and said signal line;

a second adjusting capacitor coupled between said second bit line and said signal line; and a sense amplifier coupled to said first bit line and said second bit line;

a capacitance value of said second ferroelectric capacitor being found between a capacitance value of said first ferroelectric capacitor at the time when a logical voltage "H" is written in said first ferroelectric capacitor and a capacitance value of said first ferroelectric capacitor at the time when a logical voltage "L" is written in said first ferroelectric capacitor.

18. The semiconductor memory device of claim 17 wherein said first adjusting capacitor and said second adjusting capacitor have respectively a capacitance value decided in such a way that a potential difference between a reading potential of said first bit line and a reading potential of said second bit line at the time when the logical voltage "H" or "L" is written in said first ferroelectric capacitor is not less than a minimum operating voltage of said sense amplifier.

19. A semiconductor memory device comprising:
a plurality of pairs of a first bit line and a second bit line arranged in columns,
a plurality of word lines arranged in rows,
a plurality of plate electrodes,
a plurality of sense amplifiers coupled to said first bit line and said second bit line,
a plurality of pairs of a first adjusting capacitor coupled to said first bit line and a second adjusting capacitor coupled to said second bit line, respectively, and
a plurality of memory cells arranged in rows and columns,
each memory cell comprising a first MOS transistor, a second MOS transistor, a first ferroelectric capacitor having a pair of electrodes and a second ferroelectric capacitor having a pair of electrodes,
the drain of said first MOS transistor being coupled to said first bit line and the drain of said second MOS transistor being coupled to said second bit line respectively,
the source of said first MOS transistor being coupled to one electrode on one side of said first ferroelectric capacitor and the source of said second MOS transistor being coupled to one electrode on one side of said second ferroelectric capacitor,
the other electrode of said first ferroelectric capacitor and the other electrode of said second ferroelectric capacitor being coupled to said plate electrode.

20. A semiconductor memory device comprising:
a pair of a first bit line and a second bit line;
a word line;
a plate electrode;
a ferroelectric capacitor having a first electrode and a second electrode, said second electrode being coupled to said plate electrode;
a MOS transistor the source of which is coupled to said first electrode, the gate is coupled to said word line and the drain is coupled to said first bit line; and
a sense amplifier to which said first bit line and said second bit line are coupled;
wherein said ferroelectric capacitor has a capacitance value decided in such a way that a potential difference between a reading potential of said first bit line and a reading potential of said second bit line is not less than a minimum operating voltage of said sense amplifier.

21. A semiconductor memory device comprising:
a first bit line and a second bit line forming a pair;
a first word line and a second word line;
a first plate electrode and a second plate electrode;
a signal line;
a first ferroelectric capacitor coupled to said first plate electrode and a second ferroelectric capacitor electrode coupled to said second plate electrode;
a first MOS transistor the source of which is coupled to said first ferroelectric capacitor, the gate is coupled to said first word line and the drain is coupled to said first bit line;
a second MOS transistor the source of which is coupled to said second ferroelectric capacitor, the gate is coupled to said second word line and the drain is coupled to said second bit line; and
a sense amplifier coupled to said first bit line and said second bit line;
wherein said first ferroelectric capacitor and said second ferroelectric capacitor have respectively a capacitance value decided in such a way that a potential difference between a reading potential of said first bit line and a reading potential of said second bit line at the time when a logical voltage "H" or "L" is written in said first ferroelectric capacitor is not less than a minimum operating voltage of said sense amplifier.

* * * * *